United States Patent [19]

Ashe et al.

[11] Patent Number: 5,467,044
[45] Date of Patent: Nov. 14, 1995

[54] CMOS INPUT CIRCUIT WITH IMPROVED SUPPLY VOLTAGE REJECTION

[75] Inventors: James Ashe, Saratoga; Derek F. Bowers, Sunnyvale, both of Calif.

[73] Assignee: Analog Devices, Inc., Norwood, Mass.

[21] Appl. No.: 345,579

[22] Filed: Nov. 28, 1994

[51] Int. Cl.$^6$ .......................... H03L 5/00; H03K 19/0175
[52] U.S. Cl. .............................. 327/333; 326/62; 326/68; 326/71
[58] Field of Search ...................................... 327/333, 541, 327/544, 546; 326/17, 21, 32, 33, 34, 73, 74, 121, 62, 71, 65

[56] References Cited

U.S. PATENT DOCUMENTS

| | | | |
|---|---|---|---|
| 4,475,050 | 10/1984 | Noufer | 307/475 |
| 4,713,600 | 12/1987 | Tsugaru et al. | 327/333 |
| 4,786,830 | 11/1988 | Foss | 307/475 |
| 4,845,381 | 7/1989 | Cuevas | 327/333 |
| 5,079,439 | 1/1992 | Wanlass | 327/333 |
| 5,304,867 | 4/1994 | Morris | 327/333 |

OTHER PUBLICATIONS

Hodges and Jackson, *Analysis and Design of Digital Integrated Circuits*, McGraw-Hill, Inc., 1983, pp. 97–101.

Primary Examiner—Timothy P. Callahan
Assistant Examiner—Kenneth B. Wells
Attorney, Agent, or Firm—Koppel & Jacobs

[57] ABSTRACT

A CMOS input circuit that has a first inverter stage for comparing non rail-to-rail digital input voltages to a threshold voltage, and producing inverted CMOS output voltages is disclosed. The inverted output voltages are approximately equal to a low CMOS supply voltage plus an offset voltage and a high CMOS supply voltage. The inverter includes PMOS and NMOS transistors that are connected to receive a common input voltage at their gates and to have a common drain current. The PMOS' source is connected to the high supply voltage, and the NMOS' source is connected through a voltage drop circuit element to the low supply voltage. The inverted output voltage is produced at the connection of the PMOS and NMOS transistors' drains. The NMOS and PMOS transistors have gate width and length parameters $W_N$, $L_N$ and $W_P$, $L_P$, respectively. The ratio $$\frac{W_N L_P}{W_P L_N}$$

is selected so that the threshold voltage is set between the maximum low and minimum high input signals for a desired range of high supply voltages. A second logic gate responds to the offset low and high inverted output voltage signals and produces CMOS compatible voltages.

14 Claims, 2 Drawing Sheets

CMOS INPUT CIRCUIT WITH IMPROVED SUPPLY VOLTAGE REJECTION

BACKGROUND OF THE INVENTION

FIELD OF THE INVENTION

The present invention generally relates to the field of CMOS input circuits, and more specifically to a CMOS input circuit having improved supply voltage rejection.

DESCRIPTION OF THE RELATED ART

Complementary metal-oxide semiconductor (CMOS) digital circuits typically switch between approximately the positive supply voltage and ground (rail-to-rail), whereas transistor-transistor logic (TTL) circuits switch between voltage levels inside the CMOS range (non rail-to-rail). CMOS input circuits are used to convert non rail-to-rail input voltages such as TTL compatible voltages into CMOS compatible voltages. The current industry standard for TTL compatible digital inputs is a minimum high input voltage $V_h$ of 2.4 volts and a maximum low input voltage $V_l$ of 0.8 volts. In CMOS circuitry, the positive supply voltage is usually between 2.7 and 5.5 volts.

A CMOS input circuit includes a CMOS inverter stage for converting the input voltage into inverted CMOS compatible voltages. The inverter compares the input voltage to a threshold voltage and produces a high output voltage when the input is less than the threshold and a low output voltage when the input is greater than the threshold. A standard CMOS inverter stage is disclosed in Hodges and Jackson, *Analysis and Design of Digital Integrated Circuits*, McGraw-Hill, Inc., 1983 pages 97–101. Hodges' inverter includes PMOS and NMOS transistors that are connected so that a common drain current flows through both devices. The PMOS' source is connected to the positive supply voltage, and the NMOS' source is connected to ground. Applying a common digital input voltage to the transistors' gates produces an inverted output voltage at their drain connection.

The inverter's threshold voltage $V_m$ is determined by equating the drain currents of the NMOS and PMOS transistors, and is given by:

$$V_T = \frac{V_{DD} - |V_{TP}| + \sqrt{\frac{2.5 W_N L_P}{W_P L_N}} (V_{TN})}{1 + \sqrt{\frac{2.5 W_N L_P}{W_P L_N}}} \quad (1)$$

where $V_{DD}$ is the positive supply voltage, $V_{TP}$ is the threshold voltage of the PMOS transistor, $V_{TN}$ is the threshold voltage of the NMOS transistor, $W_N$ and $L_N$ are the gate width and length of the NMOS, respectively, and $W_P$ and $L_P$ are the gate width and length of the PMOS, respectively. The constant 2.5 compensates for the difference in electron and hole mobilities between the transistors. The $V_{TN}$ and $V_{TP}$ parameters have nominal values of 0.7 V and 0.9 V, respectively, at room temperature (25° C). The threshold voltage is sensitive to transistor processing variations, changes in the operating temperature and changes in the supply voltage. Logic errors can occur when the threshold voltage is shifted below the low input voltage or above the high input voltage.

To provide a TTL compatible inverter, the ratio $$\frac{W_N L_P}{W_P L_N}$$

is selected in accordance with equation 1 and the specified supply voltage and nominal parameter values to establish a threshold between the minimum high and maximum low TTL levels, $V_h > V_T > V_l$. The ratio is typically set at approximately 2 to 1, or 3 to 1. A larger ratio causes the NMOS to conduct at a lower voltage, thereby reducing the threshold voltage. If the ratio is too high, the threshold voltage will fall below the maximum low TTL voltage. This can cause switching errors.

It is possible, for a single supply voltage or a very narrow range of supply voltages, to select a ratio that provides an adequate threshold voltage over the range of values for $V_{TN}$ and $V_{TP}$. However, at the relatively low ratio needed to establish the threshold voltage between the TTL levels, the threshold voltage is sensitive to variations in the supply voltage $V_{DD}$, i.e. supply voltage rejection is poor. As a result, an input circuit designed for use with a 5.5 volt supply can not be used reliably with a 2.7 volt supply.

For example, $V_{TN}$ and $V_{TP}$ can vary between approximately 0.5 and 0.9 V, and 0.7 and 1.1 V, respectively, due to processing variations, and fluctuate by an additional −2.5 mV/°C. over the temperature range of −55° C. to 125° C. A ratio of 3:1 produces worst case thresholds of approximately 2.05 V and 0.66 V for the 5.5 V and 2.7 V supplies, respectively. The lower threshold is outside the standard TTL range. Therefore, a low input voltage of 0.75 V would be switched to ground, producing a logic error in the circuit. Reducing the ratio to bring the minimum threshold for the 2.7 V supply within range causes the maximum threshold for the 5.5 V supply to be increased above $V_h$.

Hodges' inverter requires a small ratio, typically less than 3, to establish a reliable threshold voltage within the TTL range for a given high supply voltage. Consequently, the input circuit has poor supply voltage rejection. This limits the range of supply voltages for which the input circuit can be reliably used.

SUMMARY OF THE INVENTION

The present invention provides a CMOS input circuit with improved supply voltage rejection.

This is accomplished with an input circuit that includes an inverter stage that compares non rail-to-rail digital input voltages to a threshold voltage, and produces inverted voltages that swing between the high supply voltage and the low supply voltage plus an offset voltage. The inverter includes PMOS and NMOS transistors that are connected to have a common drain current. The NMOS and PMOS transistors have gate width and length parameters $W_N$, $L_N$ and $W_P$, $L_P$, respectively. The PMOS' source is connected to the high supply voltage, and the NMOS' source is connected through a constant voltage drop circuit element to the low supply voltage. A common digital input voltage is applied to the transistors' gates, which produces an inverted output voltage at their drain connection. The magnitude of the ratio $$\frac{W_N L_P}{W_P L_N}$$

is selected so that the threshold voltage is set between the maximum low and minimum high input voltages for a desired range of high supply voltages. A second logic gate produces CMOS compatible voltages in response to the offset low and high inverted output voltage signals.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION OF THE INVENTION

The invention provides a CMOS input circuit, and specifically a CMOS inverter stage, with improved supply voltage rejection. By reducing the inverter's sensitivity to changes in the supply voltage, an input circuit can be used reliably over a wider range of supply voltages. For illustration, the invention is described with respect to the current TTL convention for input voltages, but is not limited to that convention. The invention is generally applicable to any non rail-to-rail input voltage, and is particularly applicable to those conventions in which the minimum high and maximum low voltage levels are close together, and thus susceptible to shifts in the inverter's threshold voltage.

Figure 1:
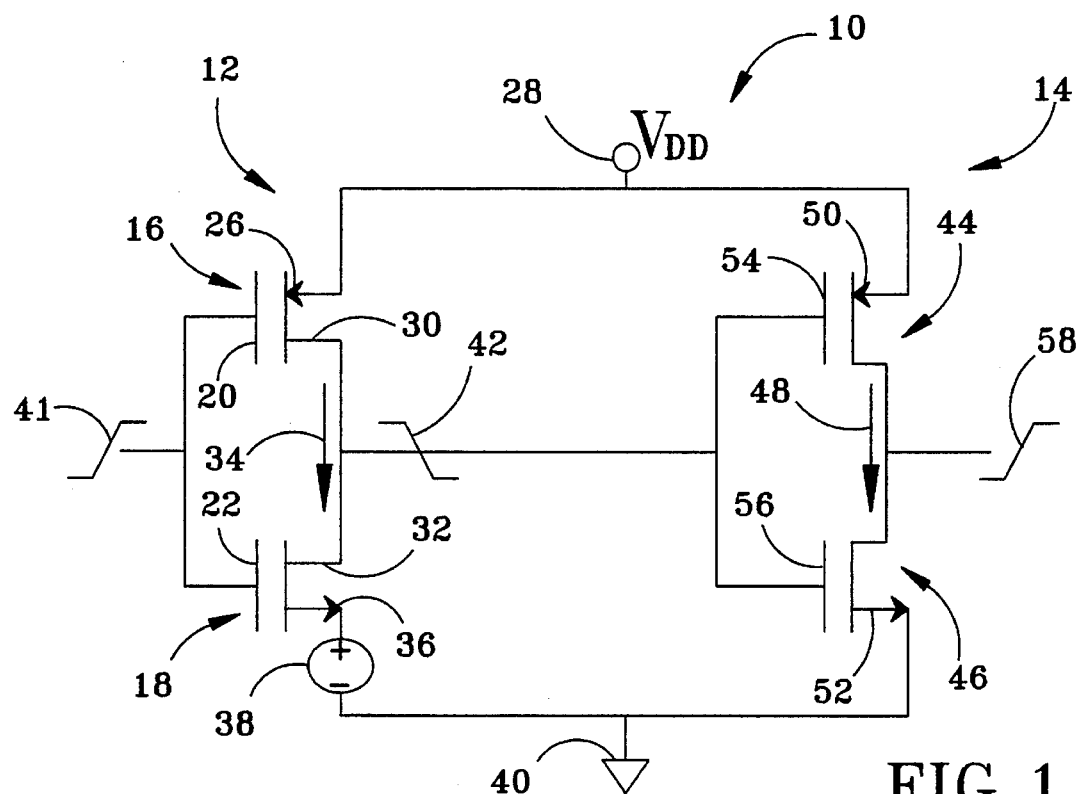
FIG. 1 is a schematic diagram of a CMOS input circuit that includes first and second inverter stages.

FIG. 1 is a schematic diagram of a CMOS input circuit 10 that includes a first inverter stage 12 and a logic stage 14. As shown, the logic stage 14 is a second inverter. In general, the design of the logic stage 14 will depend upon the specific function (NAND, AND or OR) of the circuit.

The input circuit 10 converts digital input voltages into CMOS compatible voltages. For TTL compatible signals, the low input voltages have a maximum value of approximately 0.8 volts and the high input voltages have a minimum value of at least approximately 2.4 volts. The input circuit 10 maps a low input voltage to approximately the low supply voltage, typically ground, and maps a high input voltage to approximately the high supply voltage, typically 2.7–5.5 volts.

The first inverter stage 12 includes a PMOS transistor 16 and an NMOS transistor 18 with gates 20 and 22, respectively. The PMOS' source 26 is connected to a high supply voltage 28, and its drain 30 is connected to the NMOS' drain 32 so that a common drain current 34 flows through both devices 16 and 18. The NMOS' source 36 is connected through a voltage offset element 38 to a low supply voltage 40, typically ground reference potential.

The voltage offset element 38 provides an offset voltage that increases the circuit's threshold voltage. The offset voltage is preferably approximately equal to a base-emitter voltage drop (0.7 V). Specific embodiments of the voltage offset element 38 are shown in FIGS. 4a–4e. If the low supply voltage 40 is a negative supply voltage instead of ground, a plurality of voltage offset elements 38 can be stacked to provide the desired offset.

A common TTL compatible input voltage 41 is applied to the NMOS and PMOS gates 20 and 22. When the TTL input voltage 41 is high, greater than approximately 2.4 V, the NMOS transistor 18 conducts and the PMOS transistor 16 is cut-off. Thus, the common drain current 34 is limited to the PMOS leakage current. The small leakage current flowing through the highly conductive NMOS transistor 18 produces an inverted output voltage 42 approximately equal to the offset voltage. Conversely, when the input voltage is low, less than approximately 0.8 V, the PMOS transistor 16 conducts and the NMOS transistor 18 is cut-off, limiting the drain current 34 to the NMOS leakage current. The small leakage current flowing through the highly conductive PMOS transistor 16 produces an inverted output voltage 42 close to the high supply voltage 28. When the output voltage 42 is fully switched to either the supply voltage 28 or the offset voltage, the drain current 34 is limited to the device leakage current and the circuit's power dissipation is very low, typically in the nanowatt range.

The threshold voltage $V_T$ for the first stage is found by equating the saturated drain currents for the NMOS and PMOS devices, letting the threshold voltage equal the input voltage ($V_T = V_i$) and solving for $V_T$. The drain current $I_{DN}$ for the NMOS is given by:

$$I_{DN} = K_N \frac{W_N}{2L_N} (V_i - V_{TN} - V_{OFF})^2 \quad (2)$$

where $K_N$ is a constant, $L_N$ is the gate length, $W_N$ is the gate width, $V_i$ is the input voltage, $V_{TN}$ is the NMOS threshold voltage and $V_{OFF}$ is the offset voltage. The PMOS drain current $I_{DP}$ is similar:

$$I_{DP} = K_P \frac{W_P}{2L_P} (V_{DD} - V_i - |V_{TP}|)^2 \quad (3)$$

where $K_P$ is a constant, $L_P$ is the gate length, $W_P$ is the gate width, $V_i$ is the input voltage and $V_{TP}$ is the PMOS threshold voltage.

The threshold voltage is given by:

$$V_T = \frac{V_{DD} - |V_{TP}| + \sqrt{\frac{2.5 W_N L_P}{W_P L_N}} (V_{OFF} + V_{TN})}{1 + \sqrt{\frac{2.5 W_N L_P}{W_P L_N}}} \quad (4)$$

where $K_N = 2.5 \times K_P$.

To compensate for the offset voltage provided by voltage offset element 38, the ratio $$\frac{W_N L_P}{W_P L_N}$$

is increased. This reduces the voltage required to saturate the NMOS 18, and hence reduces the threshold voltage $V_T$. The ratio is preferably set at a level that is high enough to establish a TTL compatible threshold voltage. Preferably, the ratio is set by keeping the gate lengths approximately constant and changing the widths. Increasing the ratio substantially improves the input circuit's supply voltage rejection and generally reduces its sensitivity to processing variations and temperature fluctuations.

In general, the offset voltage can be greater than or less than a base-emitter voltage, depending upon the application. The greater the offset voltage, the larger the ratio will have to be to establish a compatible threshold voltage. This will improve the supply voltage rejection even more. However, since the threshold voltage sensitivity decreases in accordance with the square root of the threshold, the device geometries needed to provide a high enough ratio can become impractical. Conversely, if the offset voltage is reduced, the ratio will also have to be reduced with a corresponding reduction in supply voltage rejection.

$V_{TN}$ and $V_{TP}$ can vary between approximately 0.5 and 0.9 V and 0.7 and 1.1 V, respectively, due to processing variations, and fluctuate by an additional −2.5 mV/°C. over the temperature range of −55° C. to 125° C. The offset voltage is typically a base-emitter voltage $V_{be}$, which is approximately 0.7 V at room temperature and changes by −2 mV/°C. The worst case thresholds for $$\frac{W_N L_P}{W_P L_N}$$

ratio of 40:3 are approximately 2.32 V and 0.89 V for the 5.5 V and 2.7 V supplies, respectively. Both of these thresholds are TTL compatible. The 40:3 ratio in the present circuit reduces the threshold voltage's sensitivity to changes in the supply voltage by approximately half compared to a ratio of 3:1 in Hodge's circuit.

The input circuit's second inverter stage 14 includes a PMOS transistor 44 and NMOS transistor 46 that are connected so that a common drain current 48 flows through both devices. The PMOS source 50 is connected to the high supply voltage 28 and the NMOS source 52 is connected to ground 40. The first inverter stage's output voltage 42 is provided as an input to gates 54 and 56 of the PMOS and NMOS transistors. The input circuit's output voltage 58 is measured between the NMOS transistor's drain and ground 40. The equality of the drain currents for transistors 44 and 46 ignores any low level leakage current through the output 58, and similarly the equality between the drain currents of transistors 16 and 18 ignores any low level leakage current into the second stage.

The output voltage 42 from the first inverter stage 12 switches between the offset voltage, approximately 0.7 V, and the high supply voltage 28. To ensure that the output voltage 58 of the second stage 14 swings between approximately the positive supply 28 and ground 40, the ratio $$\frac{W_N L_P}{W_P L_N}$$

in the second inverter stage 14 is set to a small enough value, preferably approximately 3:40, that the PMOS 44 is fully saturated by the low output voltage 42. If the ratio is too big the NMOS 46 will not be completely cut-off, the output voltage 58 will not reach the high supply 28 and the circuit's power dissipation will increase.

Figure 2:
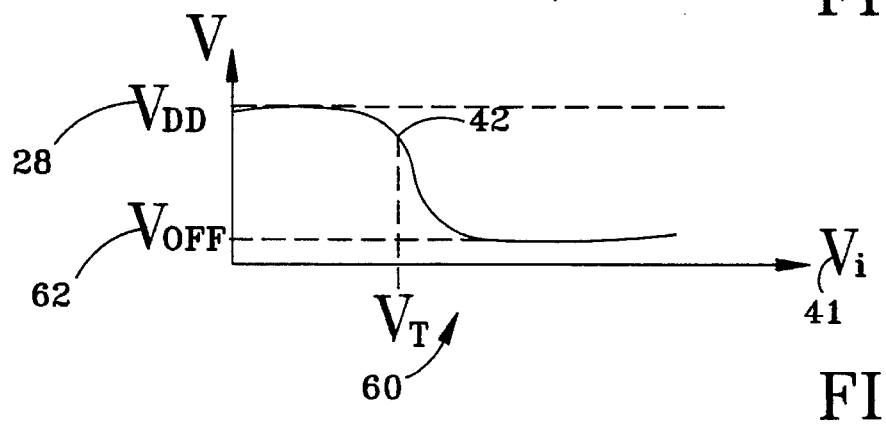
FIG. 2 is a voltage transfer curve for the first inverter stage of FIG. 1.

As illustrated by the voltage transfer curve in FIG. 2, the first inverter stage's output voltage 42 is approximately equal to the high supply voltage 28 when the TTL input voltage 41 is less than the threshold voltage $V_T$ 60. When the input voltage 41 exceeds the threshold voltage, the inverter's output voltage 42 switches to approximately the offset voltage 62.

Figure 3:
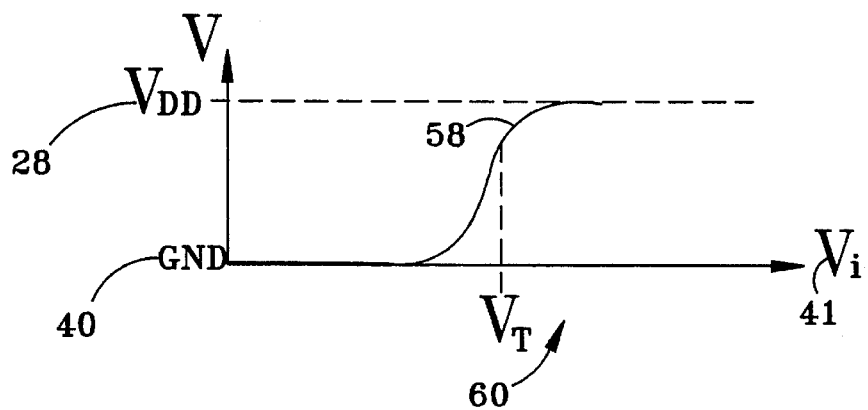
FIG. 3 is a voltage transfer curve for the overall circuit of FIG. 1.

FIG. 3 shows the voltage transfer curve for the CMOS input circuit 10. The TTL low input voltages are mapped to approximately ground reference potential 40, and the TTL high input voltages are mapped to approximately the high supply voltage 28.

Figure 4B:
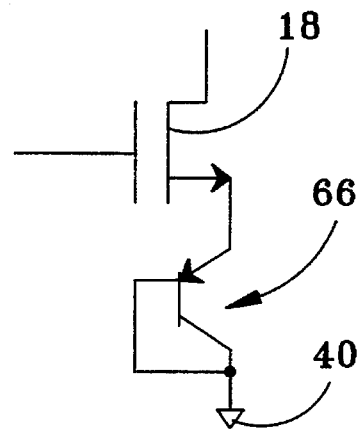
FIGS. 4a through 4e are schematic diagrams showing alternate embodiments of an offset voltage element that provides an offset voltage used in the FIG. 1 circuit.
Figure 4A:
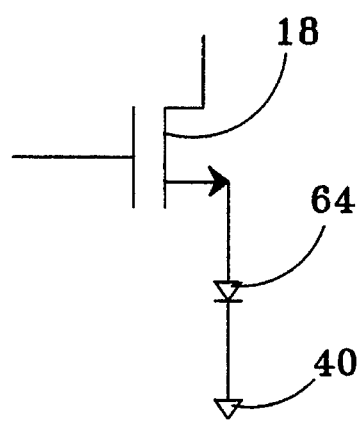
Figure 4C:
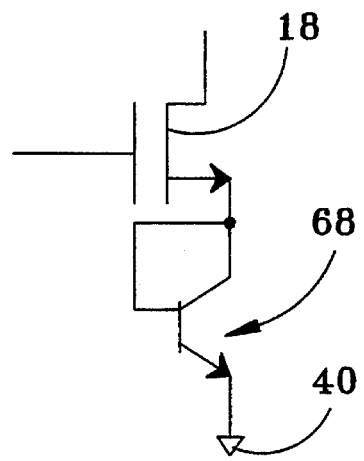
Figure 4E:
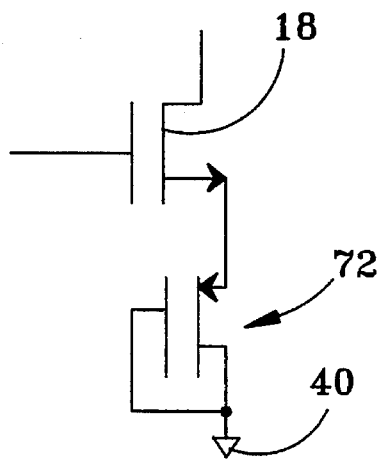
Figure 4D:
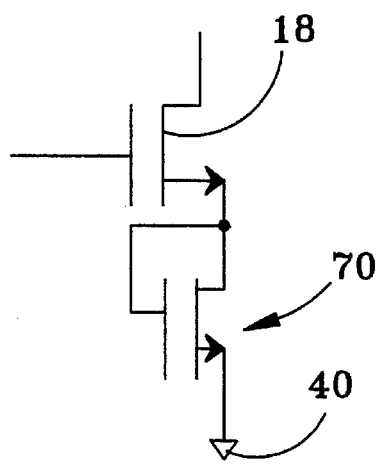

As illustrated in FIGS. 4a–4e, the voltage offset element 38 that is connected between the source of NMOS 18 and ground 40 is in general a diode 64 (FIG. 4a) that can be implemented with either bipolar or CMOS transistors. The base-emitter and drain-source voltages for the bipolar and CMOS transistors, respectively, are approximately 0.7 V. In FIG. 4b the emitter of a pnp transistor 66 is connected to the NMOS source and the pnp transistor's base and collector are connected to ground. In FIG. 4c the base and collector of an npn transistor 68 are connected to the NMOS source and the npn transistor's emitter is tied to ground. In FIG. 4d the gate and source of an NMOS transistor 70 are connected to the source of NMOS 18, and the transistor's drain is connected ground. In FIG. 4e the source of a PMOS transistor 72 is connected to the NMOS source, and the transistor's gate and drain are connected to ground. Other circuit configurations that provide a relatively constant offset voltage can be used without departing from the scope of the invention.

While several illustrative embodiments of the invention have been shown and described, numerous variations and alternative embodiments will occur to those skilled in the art. Such variations and alternate embodiments are contemplated, and can be made without departing from the spirit and scope of the invention as defined in the appended claims.

I claim:

1. A CMOS input circuit with improved supply voltage rejection, comprising:

a high voltage node for receiving a high supply voltage $V_{DD}$;

a low voltage node for receiving a low supply voltage $V_{LS}$;

an input node for receiving an input voltage signal that has a high logic value of at least $V_H$ and a low logic value of at most $V_L$;

a first PMOS transistor having a gate with a predetermined geometry, a drain and a source, said PMOS gate being connected to said input node and said PMOS source being electrically coupled to said high voltage node;

a first NMOS transistor having a gate with a predetermined geometry, a drain and a source, said NMOS gate being connected to said input node and said NMOS drain being connected to the PMOS drain so that said transistors conduct a common drain current;

a voltage offset element that is connected between the NMOS source and said low voltage node to set the voltage at the source of the first NMOS transistor at an offset voltage $V_{off}$ above the low supply voltage;

said input circuit establishing a threshold voltage $V_T$ that is a function of said high and low supply voltages, said offset voltage and the PMOS and NMOS gate geometries so that (a) when said input signal voltage exceeds $V_T$ said first NMOS transistor is relatively more conductive than said first PMOS transistor such that said common drain current flowing through said transistors produces an output voltage signal at their drain connection, said output voltage signal having a low logic value of approximately said offset voltage above the low supply voltage, and (b) when said input signal voltage is less than $V_T$ said first PMOS transistor is relatively more conductive than said first NMOS transistor such that said common drain current produces said output voltage signal with a high logic value of approximately said high supply voltage, the transistors' having gate geometries that set the gate-to-source voltage required to saturate the first NMOS transistor at a low enough value to offset the effect of said voltage offset element on $V_T$ so that $V_T > V_L$ over a predetermined range of high supply voltages, where said range is larger than it would be absent said voltage offset element,; and a logic circuit that is connected between said high and low voltage nodes and is driven by said output voltage signal to produce a CMOS compatible voltage signal that has a high logic value of approximately said high supply voltage and a low logic value of approximately said low supply voltage.

2. The CMOS circuit of claim 1, wherein said first PMOS gate has a width $W_P$, a length $L_P$, a threshold voltage $V_{TP}$, and hole mobility $K_P$, and said first NMOS gate has a width $W_N$, a length $L_N$, a threshold voltage $V_{TN}$, and electron mobility $K_N$, so that the threshold voltage $V_T$ is given by:

$$V_T = \frac{V_{DD} - |V_{TP}| + \sqrt{\frac{K_N W_N L_P}{K_P W_P L_N}} \ (V_{LS} + V_{OFF} + V_{TN})}{1 + \sqrt{\frac{K_N W_N L_P}{K_P W_P L_N}}}$$

the ratio $$\frac{W_N L_P}{W_P L_N}$$

being large enough to offset the increase in $V_T$ caused by offset voltage $V_{off}$ so that $V_H > V_T > V_L$ over said predetermined range of high supply voltages $V_{PP}$.

3. The CMOS circuit of claim 2, wherein said voltage offset element is a diode.

4. The CMOS circuit of claim 2, wherein said voltage offset element is a pnp transistor having a base, an emitter and a collector, said pnp transistor's base and collector being connected to the low supply voltage, and said pnp transistor's emitter being connected to said NMOS' source.

5. The CMOS circuit of claim 2, wherein said voltage offset element is a npn transistor having a base, an emitter and a collector, said npn transistor's base and collector being connected to said NMOS' source, and said npn transistor's emitter being connected to the low supply voltage.

6. The CMOS circuit of claim 2, wherein said voltage offset element is a second NMOS transistor having a gate, drain and source, said second NMOS's gate and drain being connected to said first NMOS' source, and said second NMOS' source being connected to the low supply voltage.

7. The CMOS circuit of claim 2, wherein said voltage offset element is a second PMOS transistor having a gate, drain and source, said second PMOS's gate and drain being connected to the low supply voltage, and said second PMOS' source being connected to said NMOS' source.

8. The CMOS circuit of claim 1, wherein the input voltage signal is a transistor-transistor logic (TTL) signal and the offset voltage an $$\frac{W_N L_P}{W_P L_N}$$

ratio have values that produce a $V_T$ value that is compatible with said TTL signal.

9. The CMOS circuit of claim 8, wherein $V_L$ is approximately 0.8 V and $V_H$ is approximately 2.4 V.

10. The CMOS circuit of claim 8, wherein said predetermined range is approximately 2.7 V to 5.5 V.

11. The CMOS circuit of claim 10, wherein said low voltage node is connected to a ground reference potential.

12. The CMOS circuit of claim 11, wherein said ratio is approximately forty to three.

13. The CMOS circuit of claim 11, wherein said offset voltage is approximately equal to a bipolar transistor base-emitter voltage.

14. The CMOS circuit of claim 1, wherein said logic circuit is an inverter that comprises:

a second PMOS transistor having a gate with a predetermined width $W_{P2}$ and length $L_{P2}$, a drain and a source, said second PMOS source being connected to the high voltage node; and a second NMOS transistor having a gate with a predetermined width $W_{N2}$ and length $L_{N2}$, a drain and a source, said second NMOS drain being connected to said second PMOS drain, said second NMOS source being connected to the low voltage node and said second PMOS and NMOS transistors' gates being connected together to receive said output voltage signal;

the ratio $$\frac{W_N L_P}{W_P L_N}$$

being small enough that said second NMOS and PMOS transistors respectively saturate and cut-off when said output signal voltage has a high logic value to produce a CMOS compatible voltage signal at their drain connection which has a low logic value at approximately said low supply voltage, and respectively cut-off and saturate when said output voltage signal has a low logic value to produce a CMOS compatible voltage signal with a high logic value at approximately said high supply voltage.

* * * * *